US012497983B2

(12) United States Patent
Park et al.

(10) Patent No.: US 12,497,983 B2
(45) Date of Patent: Dec. 16, 2025

(54) SYSTEMS AND METHODS RETAINING COMPONENTS IN AN ELECTRONIC DEVICE

(71) Applicant: Microsoft Technology Licensing, LLC, Redmond, WA (US)

(72) Inventors: Joseph Juseop Park, Seattle, WA (US); Anne Maristella Pirie, Shoreline, WA (US); Michael Cameron Gordon, Sammamish, WA (US); Ryan Travis Evans, Bellevue, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 564 days.

(21) Appl. No.: 17/918,075

(22) PCT Filed: Apr. 8, 2021

(86) PCT No.: PCT/US2021/026456
§ 371 (c)(1),
(2) Date: Oct. 10, 2022

(87) PCT Pub. No.: WO2021/207544
PCT Pub. Date: Oct. 14, 2021

(65) Prior Publication Data
US 2023/0160406 A1 May 25, 2023

(30) Foreign Application Priority Data
Apr. 8, 2020 (NL) .................................... 2025299

(51) Int. Cl.
*F16B 5/02* (2006.01)
*H05K 1/18* (2006.01)
*H05K 3/30* (2006.01)

(52) U.S. Cl.
CPC ................. *F16B 5/02* (2013.01); *H05K 1/18* (2013.01); *H05K 3/30* (2013.01); *H05K 2201/10598* (2013.01)

(58) Field of Classification Search
CPC ... F16B 5/02; H05K 1/18; H05K 3/30; H05K 2201/10598; H05K 7/142
See application file for complete search history.

(56) References Cited

U.S. PATENT DOCUMENTS 2,342,170 A * 2/1944 Tinnerman ............ F16B 5/0208
411/246
3,651,545 A 3/1972 Hara
(Continued)

FOREIGN PATENT DOCUMENTS

CN 1615245 A 5/2005
CN 2877950 Y 3/2007
(Continued)

OTHER PUBLICATIONS

Translation of DE 10-2016-110251 (Year: 2016).*
(Continued)

*Primary Examiner* — Jeffrey T Carley
(74) *Attorney, Agent, or Firm* — Ray Quinney & Nebeker P.C.; Paul N. Taylor

(57) ABSTRACT

A fastener (100) for retaining a plurality of components (334, 348) in an electronic device includes a body (102) with a bottom end and a top end, where the bottom end includes a mechanical interlocking feature (104) integrally formed with the bottom end and the top end includes a head (106) integrally formed with the top end. Between the head (106) and the mechanical interlocking feature (104), the body includes an integrally formed shoulder (108). A neck (110) is positioned between the shoulder (108) and the head (106)

(Continued)

with a neck outer diameter that is less than a head outer diameter and a shoulder outer diameter.

20 Claims, 4 Drawing Sheets

(56) References Cited

U.S. PATENT DOCUMENTS

| | | | |
|---|---|---|---|
| D414,403 S * | 9/1999 | Coven | D8/387 |
| 5,980,177 A * | 11/1999 | Schiess | F16B 37/085 411/437 |
| 6,394,807 B2 | 5/2002 | Robinson | |
| 6,781,055 B2 | 8/2004 | Chen | |
| 8,292,562 B2 | 10/2012 | Chiu | |
| 9,097,379 B1 | 8/2015 | Strasser et al. | |
| 9,347,477 B2 | 5/2016 | Anderson | |
| 9,512,637 B2 * | 12/2016 | Ramsauer | F16B 5/0642 |
| 9,689,511 B1 * | 6/2017 | Thornton | H02G 3/30 |
| 9,982,837 B2 | 5/2018 | Zhang et al. | |
| 10,462,910 B2 * | 10/2019 | Brodbeck | F16B 21/082 |
| 11,259,416 B2 * | 2/2022 | Brodbeck | F16B 21/082 |
| 11,519,441 B2 * | 12/2022 | Liebelt | F16B 5/065 |
| 2003/0230429 A1 | 12/2003 | Chen | |
| 2005/0047860 A1 | 3/2005 | Deas et al. | |
| 2006/0056159 A1 | 3/2006 | Lee | |
| 2011/0228451 A1 * | 9/2011 | Chiu | H05K 7/142 361/679.01 |
| 2014/0014407 A1 * | 1/2014 | Krieg | F16G 11/06 24/135 R |
| 2017/0074305 A1 | 3/2017 | Nijdam et al. | |
| 2018/0283436 A1 | 10/2018 | Levey | |
| 2019/0323313 A1 | 10/2019 | Liew | |

FOREIGN PATENT DOCUMENTS

| | | | |
|---|---|---|---|
| CN | 201310717 Y | 9/2009 | |
| CN | 102595785 A | 7/2012 | |
| CN | 202833555 U | 3/2013 | |
| CN | 203548501 U | 4/2014 | |
| CN | 104216468 A | 12/2014 | |
| CN | 104246243 A | 12/2014 | |
| CN | 106304829 A | 1/2017 | |
| CN | 108223511 A | 6/2018 | |
| CN | 207647941 U | 7/2018 | |
| CN | 110159635 A | 8/2019 | |
| CN | 110891383 A | 3/2020 | |
| DE | 202005020842 U1 | 9/2006 | |
| DE | 102016110251 B4 * | 11/2020 | F16B 33/008 |
| EP | 0878591 A1 | 11/1998 | |
| EP | 1136646 A2 | 9/2001 | |
| EP | 1801688 A2 | 6/2007 | |
| EP | 3522301 A1 | 8/2019 | |
| GB | 2580131 A * | 7/2020 | F16B 21/18 |
| KR | 20110113961 A * | 10/2011 | H01M 2/02 |
| TW | 202032026 A * | 9/2020 | F16B 33/002 |

OTHER PUBLICATIONS

Translation of KR-20110113961-A (Year: 2011).*
Translation of TW-202032026-A (Year: 2020).*
"Search Report Issued in Netherlands Application No. N2025299", Mailed Date : Feb. 4, 2021, 15 Pages.
"International Search Report and Written Opinion Issued in PCT Application No. PCT/US21/026456", Mailed Date: Jul. 12, 2021, 16 Pages.
Communication under Rule 71(3) Received in European Patent Application No. 21720944.4, mailed on Dec. 6, 2023, 08 pages.
Decision to Grant pursuant to Article 97(1) Received for European Application No. 21720944.4, mailed on Apr. 18, 2024, 02 pages.
First Office Action Received for Chinese Application No. 202180027673.4, mailed on Feb. 26, 2025, 13 pages (English Translation Provided).
Notice of Allowance Received for Chinese Application No. 202180027673.4, mailed on Jul. 7, 2025, 09 pages (English Translation Provided).

* cited by examiner

SYSTEMS AND METHODS RETAINING COMPONENTS IN AN ELECTRONIC DEVICE

BACKGROUND

Background and Relevant Art

Mobile, wearable, and portable computing devices package an ever-increasing number of components into a small volume. Components are positioned on housings or other circuit boards in stacks with little available space between components and within the housing of the device. Arrangement and assembly of the components of modern electronic devices are complicated by inefficient connecting of the components the housing and one another.

BRIEF SUMMARY

In some embodiments, a fastener for retaining a plurality of components in an electronic device includes a body with a bottom end and a top end, where the bottom end includes a mechanical interlocking feature integrally formed with the bottom end and the top end includes a head integrally formed with the top end. Between the head and the mechanical interlocking feature, the body includes an integrally formed shoulder. A neck is positioned between the shoulder and the head with a neck outer diameter that is less than a head outer diameter and a shoulder outer diameter.

In some embodiments, a system for retaining components in an electronic device includes a fastener and a bracket. The fastener includes a body with a bottom end and a top end, where the bottom end includes a mechanical interlocking feature integrally formed with the bottom end and the top end includes a head integrally formed with the top end. Between the head and the mechanical interlocking feature, the body includes an integrally formed shoulder. A neck is positioned between the shoulder and the head with a neck outer diameter that is less than a head outer diameter and a shoulder outer diameter. The bracket includes an aperture therethrough and at least one retention mechanism. The aperture has a width greater than the head outer diameter of the fastener. The retention mechanism is positioned in the aperture and configured to engage with the neck of the fastener.

In some embodiments, a method of manufacturing an electronic device includes positioning a first component relative to a housing and affixing the first component to the housing using a fastener. The fastener includes a body with a bottom end and a top end, where the bottom end includes a mechanical interlocking feature integrally formed with the bottom end and the top end includes a head integrally formed with the top end. Between the head and the mechanical interlocking feature, the body includes an integrally formed shoulder. A neck is positioned between the shoulder and the head with a neck outer diameter that is less than a head outer diameter and a shoulder outer diameter. The method further includes positioning a bracket relative to the first component and the fastener, where the bracket includes an aperture therethrough and at least one retention mechanism. The aperture has a width greater than the head outer diameter of the fastener. The retention mechanism is positioned in the aperture and configured to engage with the neck of the fastener. The method includes applying a force to the bracket toward the fastener to affix the bracket to the fastener.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description which follows, and in part will be obvious from the description, or may be learned by the practice of the teachings herein. Features and advantages of the disclosure may be realized and obtained by means of the instruments and combinations particularly pointed out in the appended claims. Features of the present disclosure will become more fully apparent from the following description and appended claims or may be learned by the practice of the disclosure as set forth hereinafter.

BRIEF DESCRIPTION OF THE DRAWINGS

In order to describe the manner in which the above-recited and other features of the disclosure can be obtained, a more particular description will be rendered by reference to specific embodiments thereof which are illustrated in the appended drawings. For better understanding, the like elements have been designated by like reference numbers throughout the various accompanying figures. While some of the drawings may be schematic or exaggerated representations of concepts, at least some of the drawings may be drawn to scale. Understanding that the drawings depict some example embodiments, the embodiments will be described and explained with additional specificity and detail through the use of the accompanying drawings in which.

DETAILED DESCRIPTION

The present disclosure relates generally to fasteners for coupling and retaining components. More particularly, the present disclosure relates to systems and methods for retaining components in an electronic device by affixing a fastener to a board, housing, or support, where the fastener connects at least two components to the board, housing, or support. In some embodiments, a fastener provides a compressive force to retain the first component while a second component connects or couples to a neck of the fastener. In some embodiments, the fastener is affixed to a board first and a second component is subsequently connected or coupled to the neck of the fastener.

In some embodiments, an electronic component includes a plurality of components that stacked in a vertical direction relative to a board or a housing. In conventional electronic devices, the first and second component are positioned on a board or housing and then both are retained by connecting a fastener through both components to the board or housing. This design requires both components to be positioned prior to connecting the fastener. Additionally, removal of the fastener will disconnect both of the components. However, a user may desire to affix only one of the components, such as to replace or repair the second component without removing the first component. Unnecessary movement of the components can risk damaging elements of the components, such as connection prongs, wires, transistors, capacitors, or other elements of the component circuitry.

In some embodiments of a connection system according to the present disclosure, a fastener provides both a compressive force to retain the first component on the board or housing and a connection point in or on which a second component is affixed. In a particular embodiment, the fastener is connected to a board through a hole in the first component, and a shoulder of the fastener contacts the first component to affix the first component to the board. In some embodiments, the fastener allows the second component to connect to the fastener longitudinally relative to the fastener body. In some embodiments, the fastener allows the second component to connect to the fastener laterally relative to the fastener body.

In some embodiments, the fastener includes a body with a longitudinal axis. The body has a first end and a second end positioned at opposite ends along the longitudinal axis. The first end of the body includes a mechanical interlocking feature (e.g., a threaded surface) that allows the fastener to connect to a board, housing, or other portion of an electronic device. The second end of the body includes a head. In some embodiments, the head is configured to receive torque to drive the fastener into the board, housing, or other portion of the electronic device.

Figure 1:
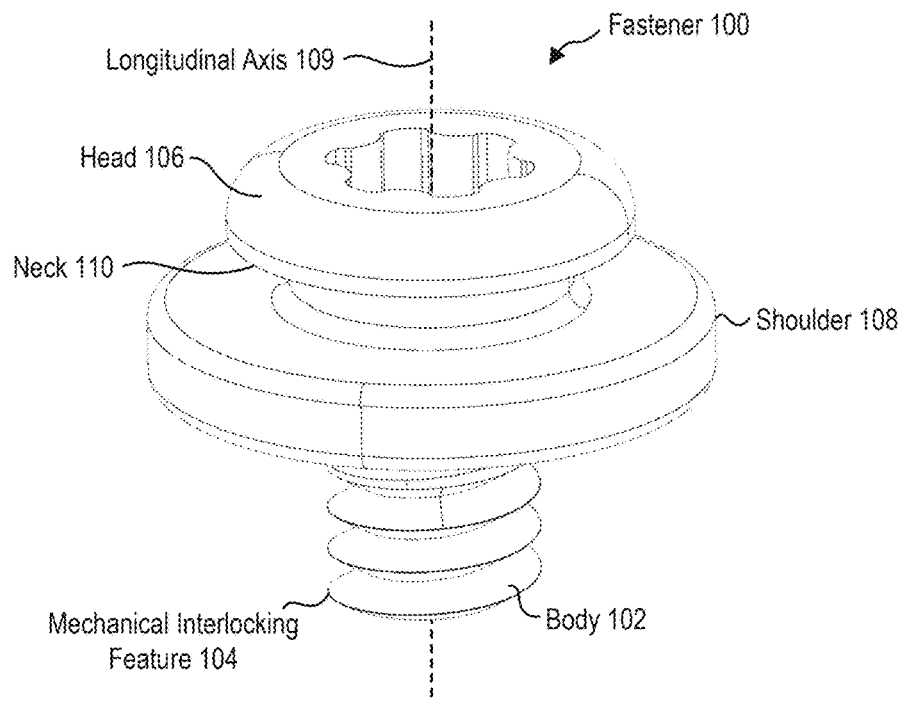
FIG. 1 is a perspective view of a fastener, according to at least some embodiments of the present disclosure.

FIG. 1 is a perspective view of an embodiment of a fastener 100 according to the present disclosure. The fastener 100 has a body 102 with a mechanical interlocking feature 104 positioned at a bottom end and a head 106 at an opposite top end. The body 102 has integrally formed shoulder 108 projecting laterally from a longitudinal axis 109 of the body 102. The neck 110 is positioned between the head 106 and the shoulder 108.

The body is made of or includes, in some embodiments, a conductive material. In some embodiments, the conductive material is iron, aluminum, titanium, copper, magnesium, or alloys thereof, such as steel. In some embodiments, the conductive material is a polymer or other conductive material impregnated with conductive filaments or particles. In some embodiments, the body is made of or includes a nonconductive material. In some embodiments, the nonconductive is a polymer or composite. In embodiments in which the body is composed of conductive material, the system may be arranged so that the fastener provides a path to electrical ground for one or both of the first and second components while the first and second components are connected to the fastener. In embodiments in which the body is composed of conductive material, the system may be arranged so that the fastener is part of an arrangement that provides shielding to reduce electromagnetic interference (EMI) for components located within the shielding (e.g., the first and/or second components).

In some embodiments, the mechanical interlocking feature(s) of the fastener includes a threaded surface. In some embodiments, the mechanical interlocking feature(s) of the fastener includes a recess to engage with the board and/or housing. In some embodiments, the mechanical interlocking feature(s) of the fastener includes a protrusion to engage with the board and/or housing. In some embodiments, the mechanical interlocking feature(s) of the fastener include a convex surface adapted to interlock with a concave surface of the board or housing, or vice versa. In some embodiments, the mechanical interlocking feature(s) of the fastener includes a twist-lock feature, such as the lugs and grooves of a BNC connector, to engage with the board and/or housing. The mechanical interlocking feature(s) of the fastener may be any feature that allows the first end of the body to engage with the board and/or housing and apply a compressive force in the longitudinal direction.

The head of the fastener is integrally formed with the rest of the body. In some embodiments, the head of the fastener is configured to receive a torque from a driver or other tool to rotate the fastener. In some embodiments, the head includes a groove or recess to receive a flathead, Phillips, Torx, Allen, or other format driver. In some embodiments, the head is configured to receive a longitudinal force. The longitudinal force may compress the fastener in the longitudinal direction and/or onto the board and/or housing.

In the embodiment of a fastener 100 illustrated in FIG. 1, the head 106 has a Torx plus recess to receive a Torx plus format driver. The torque around the longitudinal axis 109 and longitudinal force along the longitudinal axis 109 urges the threads of the mechanical interlocking feature 104 to engage with and connect to a board or housing of an electronic device.

A shoulder of the fastener may contact a first component and apply a force in the longitudinal direction to the first component. In some embodiments, the shoulder of the fastener contacts an electrical pad of the first component to provide an electrical pathway from the first component to the board and/or housing (e.g., a path to electrical ground). The shoulder projects laterally from the body perpendicularly from the longitudinal direction and is integrally formed with the body. In some embodiments, the shoulder has an upper surface and a lower surface that are substantially parallel to one another. In some embodiments, the shoulder has a lower surface that is perpendicular to the longitudinal direction and an upper surface that is curved or angled relative to the lower surface. In some embodiments, the shoulder has an upper surface that is perpendicular to the longitudinal direction and a lower surface that is curved or angled relative to the upper surface. In some embodiments, the shoulder has an upper surface that is curved or angled relative to a lateral direction and a lower surface that is curved or angled relative to the upper surface.

A fastener according to the present disclosure has a neck positioned longitudinally between the head and the shoulder. In some embodiments, the neck allows a second component to connect with and be retained by the fastener. The neck is a recess between the head and the shoulder into which a retention mechanism may engage to retain the second component.

Figure 2:
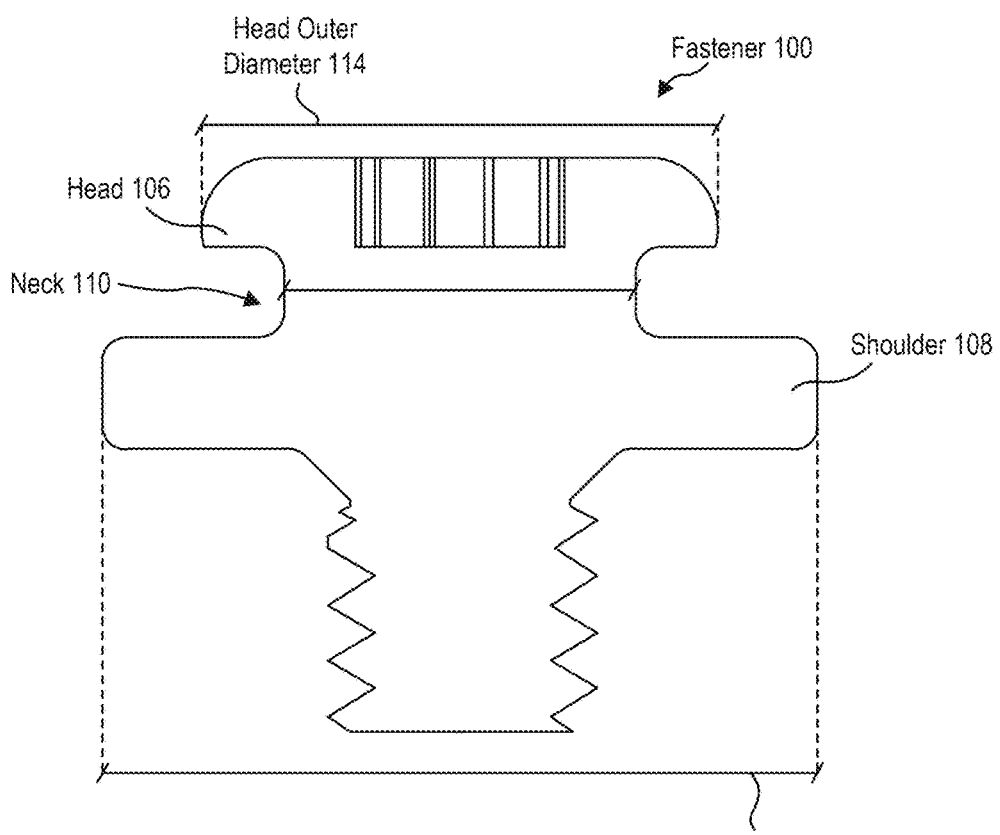
FIG. 2 is a side cross-sectional view of the fastener of FIG. 1, according to at least some embodiments of the present disclosure.

FIG. 2 illustrates the fastener 100 of FIG. 1 in a side cross-sectional view. In some embodiments, the diameters of the fastener 100 in the lateral direction vary in the longitudinal direction to form the parts of the fastener 100 while maintaining a monolithic, integrally formed fastener 100 with greater strength than a threaded rod with spacers or washers stacked thereon. In some embodiments, the head, neck, shoulder, and body of the fastener 100 are integrally formed from a single piece of material. For example, the fastener 100 may be formed by cold-forming a section of material to form the head 106, neck 110, and shoulder 108 features. In this example, the body 102 is then thread-rolled to create the mechanical interlocking feature 104.

The shoulder 108 has a shoulder outer diameter 112 that is greater than a head outer diameter 114. As described in detail below, the shoulder outer diameter being greater than the head outer diameter allows a bracket to couple to the neck 110 while inhibiting the bracket from contacting the first component In some embodiments, the shoulder outer diameter 112 and head outer diameter 114 have a shoulder diameter ratio in a range having an upper value, a lower value, or upper and lower values including 1.1, 1.2, 1.3, 1.4, 1.5, 1.75, 2.0, 2.25, 2.5, 2.75, 3.0, or any values therebetween. In some embodiments, the shoulder diameter ratio is greater than 1.1. In some embodiments, the shoulder diameter ratio is less than 3.0. In some embodiments, the shoulder diameter ratio is between 1.1 and 3.0. In some embodiments, the shoulder diameter ratio is between 1.5 and 2.5. As described further below, in some embodiments, it is critical that the shoulder diameter ratio is greater than 1.5, e.g., so that a mechanical interlocking feature (e.g., clips) of a bracket can contact and bias against both the shoulder and the head of the fastener.

The neck 110 has a neck outer diameter 116 that is less than the head outer diameter 114. As described in detail below, the neck outer diameter being less than the head outer diameter allows the second component to couple to the neck 110 while inhibiting the second component from becoming disconnected from the fastener. In some embodiments, the neck outer diameter 116 and head outer diameter 114 have a neck diameter ratio in a range having an upper value, a lower value, or upper and lower values including 0.3, 0.4, 0.5, 0.6, 0.7, 0.8, 0.9, 0.95, or any values therebetween. In some embodiments, the neck diameter ratio is greater than 0.3. In some embodiments, the neck diameter ratio is less than 0.95. In some embodiments, the neck diameter ratio is between 0.3 and 0.9. In some embodiments, the neck diameter ratio is between 0.5 and 0.75. In some embodiments, it is critical the neck diameter ratio is less than 0.8. In some embodiments, it is critical the neck diameter is greater than a diameter of the bottom end and mechanical interlocking feature to provide sufficient stability to the bracket supported by engagement with the neck. In some embodiments, the neck and shoulder have the same outer diameter (e.g., the neck outer diameter and shoulder outer diameter are equal).

Figure 3:
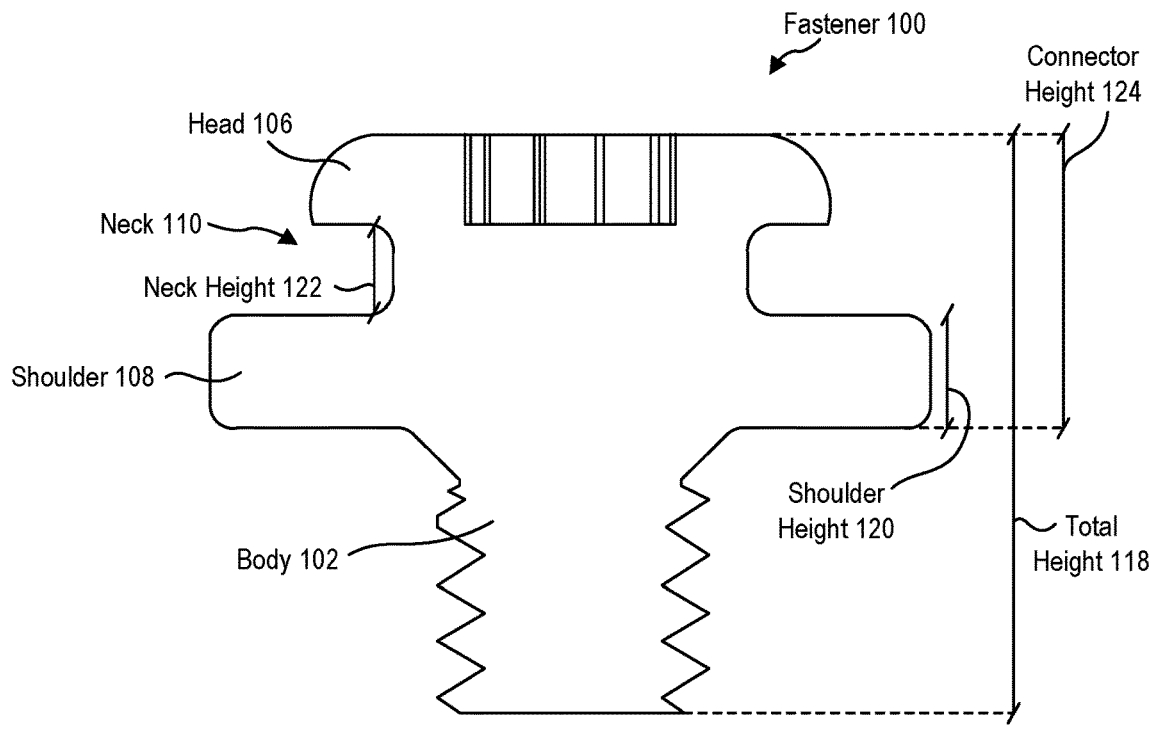
FIG. 3 is another side cross-sectional view of the fastener of FIG. 1, according to at least some embodiments of the present disclosure.

FIG. 3 illustrates the fastener 100 of FIG. 1 and FIG. 2 in a side cross-sectional view. In some embodiments, the height of the parts of the fastener 100 in the longitudinal direction provide a monolithic, integrally formed fastener 100 with greater strength than a threaded rod with spacers or washers stacked thereon.

In some embodiments, the fastener 100 has a total height 118 from the first end to the second end in the longitudinal direction (e.g., from the mechanical interlocking feature to the head). The shoulder 108 has a shoulder height 120. In some embodiments, the shoulder height 120 and total height 118 have a shoulder height ratio in a range having an upper value, a lower value, or upper and lower values including 0.05, 0.075. 0.10, 0.125, 0.15, 0.175, 0.20, 0.25, or any values therebetween. In some embodiments, the shoulder height ratio is greater than 0.05. In some embodiments, the shoulder height ratio is less than 0.25. In some embodiments, the shoulder height ratio is between 0.05 and 0.25. In some embodiments, the shoulder height ratio is between 0.10 and 0.20. In some embodiments, it is critical the shoulder height ratio is greater than 0.10 to maintain sufficient proportional strength of the shoulder 108 relative to the other areas of the fastener 100 so the shoulder 108 does not buckle, fold, bend, or otherwise deform under forces applied to other areas of the fastener 100.

In some embodiments, the shoulder height 120 is in a range having an upper value, a lower value, or upper and lower values including any of 0.3 millimeters (mm), 0.4 mm, 0.5 mm, 0.6 mm, 0.7 mm, 0.8 mm, or any values therebetween. In some embodiments, a shoulder height 120 is greater than 0.3 mm. In some embodiments, the shoulder height 120 is less than 0.8 mm. In some embodiments, the shoulder height 120 is between 0.3 mm and 0.8 mm. In some embodiments, the shoulder height 120 is between 0.4 mm and 0.6 mm.

In some embodiments, the neck 110 has a neck height 122. In some embodiments, the neck height 122 and total height 118 have a neck height ratio in a range having an upper value, a lower value, or upper and lower values including 0.025, 0.05, 0.075. 0.10, 0.125, 0.15, 0.175, 0.20, or any values therebetween. In some embodiments, the neck height ratio is greater than 0.025. In some embodiments, the neck height ratio is less than 0.20. In some embodiments, the neck height ratio is between 0.025 and 0.20. In some embodiments, the neck height ratio is between 0.05 and 0.10. In some embodiments, it is critical the neck height ratio is greater than 0.05 to maintain sufficient proportional strength of a contact between retention features of a bracket and the fastener 100.

In some embodiments, the neck height 122 is in a range having an upper value, a lower value, or upper and lower values including any of 0.25 mm, 0.3 mm, 0.4 mm, 0.5 mm, 0.6 mm, or any values therebetween. In some embodiments, a neck height 122 is greater than 0.25 mm. In some embodiments, the neck height 122 is less than 0.6 mm. In some embodiments, the neck height 122 is between 0.3 mm and 0.5 mm. In some embodiments, the neck height 122 is between 0.3 mm and 0.4 mm.

In some embodiments, a distance in the longitudinal direction from a bottom surface of the shoulder 108 to the top of the head 106 (e.g., the shoulder, neck, and head) defines a connector height 124. In some embodiments, the connector height 124 and total height 118 have a connector height ratio in a range having an upper value, a lower value, or upper and lower values including 0.10, 0.15, 0.20, 0.30 0.40, 0.50, 0.60, 0.70, or any values therebetween. In some embodiments, the connector height ratio is greater than 0.10. In some embodiments, the connector height ratio is less than 0.70. In some embodiments, the connector height ratio is between 0.10 and 0.70. In some embodiments, the connector height ratio is between 0.25 and 0.6. In some embodiments, it is critical the connector height ratio is less than 0.50 so that the fastener does not require an increase to a dimension (z-height) of the device in which it is installed.

In some embodiments, the connector height 124 is in a range having an upper value, a lower value, or upper and lower values including any of 0.5 mm, 0.6 mm, 0.7 mm, 0.8 mm, 0.9 mm, 1.0 mm, 1.1 mm, 1.2 mm, 1.3 mm, 1.4 mm, 1.5 mm, or any values therebetween. In some embodiments, a connector height 124 is greater than 0.5 mm. In some embodiments, the connector height 124 is less than 1.5 mm.

In some embodiments, the connector height 124 is between 0.5 mm and 1.5 mm. In some embodiments, the connector height 124 is between 1.0 mm and 1.4 mm. In some embodiments, it is critical that the connector height 124 is less than 1.3 mm, e.g., so that the fastener does not require an increase to a dimension (z-height) of the device in which it is installed.

In some embodiments, the total height 118 is in a range having an upper value, a lower value, or upper and lower values including any of 1.5 mm, 1.75 mm, 2.0 mm, 2.25 mm, 2.5 mm 2.75 mm, 3.0 mm, or any values therebetween. In some embodiments, a total height 118 is greater than 1.5 mm. In some embodiments, the total height 118 is less than 3.0 mm, e.g., so that the fastener does not require an increase to a dimension (z-height) of the device in which it is installed. In some embodiments, the total height 118 is between 1.5 mm and 3.0 mm. In some embodiments, the total height 118 is between 2.0 mm and 3.0 mm.

A retention system according to the present disclosure may include a fastener according to any of the embodiments described herein and a bracket that connects to the second end of the fastener (e.g., to the neck of the fastener). In some embodiments, the bracket is rigid, semi-rigid, elastic, or combinations thereof. In some embodiments, the bracket applies a compressive force to an electronic component or other component of an electronic device to hold the component in place. In some embodiments, the bracket is an electronic component of the electronic device. For example, the bracket may be a printed circuit board or other electronic component. In some embodiments, the bracket connects to the fastener to facilitate a board-to-board B2B connection. In some embodiments, the bracket is radiopaque and provides electromagnetic (EM) shielding to an electronic component covered by the bracket.

Embodiments of brackets according to the present disclosure include an aperture therein through which a portion of the fastener is positioned to connect the fastener and the bracket. In some embodiments, the aperture further includes a retention mechanism configured to engage with the fastener to connect the bracket to the fastener. The retention mechanism connects to the fastener above the shoulder. In some embodiments, the retention mechanism engages with the neck of the fastener and contacts a portion of the head adjacent the neck to limit and/or prevent movement of the bracket in the longitudinal direction of the fastener. In some embodiments, the retention mechanism is integrally formed with the bracket. In some embodiments, the retention mechanism is affixed to the bracket. In a particular embodiment, the retention mechanism is affixed in an aperture of a conventional electronic component to allow the conventional electronic component to be a bracket according to the present disclosure and connect to the fastener, as described herein.

Figure 4:
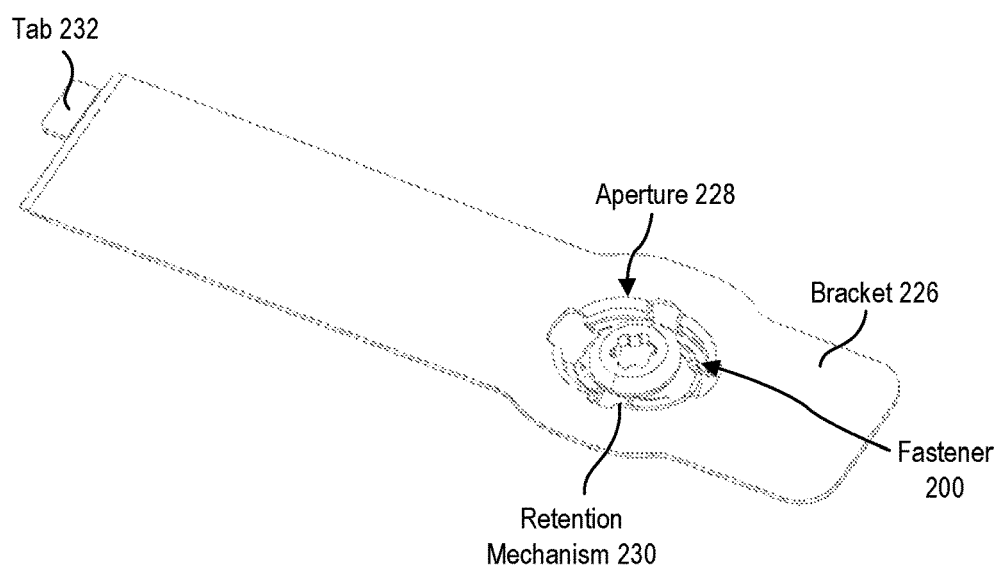
FIG. 4 is a perspective view of a fastener and a bracket, according to at least some embodiments of the present disclosure.

FIG. 4 is a perspective view of an embodiment of a fastener 200 and a bracket 226. The fastener 200 may be any embodiment of a fastener described herein (e.g., fastener 100 of FIG. 1). The fastener 200 is connectable to the bracket 226 through an aperture 228 of the bracket 226. The embodiment illustrated in FIG. 4 includes an integrally formed retention mechanism 230 (e.g., a plurality of semi-rigid protrusions) in the aperture 228 that engages with the fastener 200.

In some embodiments, the aperture 228 and retention mechanism 230 allow the bracket 226 to connect to the fastener 200 after the fastener 200 has been affixed to a board and/or housing. In some embodiments, the retention mechanism 230 and fastener 200 allow the bracket 226 and fastener 200 to rotate relative to one another, such as with the smooth surfaces of the neck of the fastener illustrated and describe in relation to FIG. 1 through 3. In some embodiments, the retention mechanism includes deformable clips, wings, tabs, clasps, etc. that allow the bracket to snap onto the head and engage with the neck of the fastener. In some embodiments, the aperture is tapered in a lateral direction relative to the longitudinal direction of the fastener, and the tapered edges of the aperture are the retention mechanism. The aperture is tapered to allow a wide portion of the aperture with a larger clip width to pass over the head but not the shoulder, e.g., due to the head and shoulder ratios described above. The taper then reduces the clip width toward a narrow portion with a second smaller clip width, which is smaller than the head outer diameter and engages with the neck to retain the bracket on the fastener.

In some embodiments, the bracket 226 includes a tab 232, or other engagement feature, at an edge of the bracket. In some embodiments, the edge is remote from, or opposite of, a portion with the aperture 228 and retention mechanism 230. The tab may engage with a slot or clip on the board and/or housing to limit and/or prevent movement of the second end relative to the board and/or housing after the retention mechanism engages with the fastener. In some embodiments, the retention mechanism is located in a first half of the bracket opposite the edge with the tab. In some embodiments, the bracket includes a plurality of engagement features, such as tabs or clips, to position and secure the bracket within the device. In some embodiments, the bracket has a plurality of retention mechanism configured to engage with a plurality of fasteners, according to the present disclosure.

Figure 5:
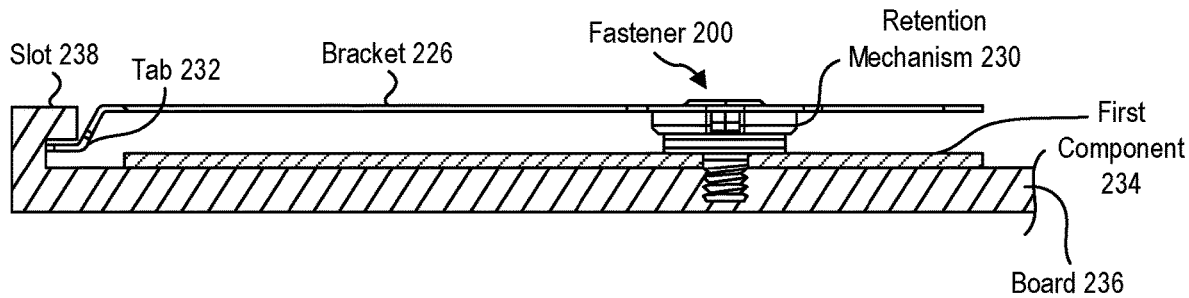
FIG. 5 is a side cross-sectional view of the fastener and bracket of FIG. 4, according to at least some embodiments of the present disclosure.

FIG. 5 is a side view of the fastener 200 and bracket 226 of FIG. 4 affixing a first component 234 to a board 236. In some embodiments, the fastener 200 is threaded into the board 236 and the shoulder 208 applies a force In some embodiments, the tab 232 of the bracket 226 is positioned in the slot 238 and/or under an overhang of the slot 238, and the bracket 226 is then forced downward (pivoting and/or rotating around the tab 232 in the slot 238) onto the fastener 200.

In some embodiments, the retention mechanism has a clip width that is the shortest distance across the aperture. In some embodiments, the retention mechanism includes at least one elastically deformable clip that elastically deforms around the head of the fastener. In the elastically deformed state, the clip width of the retention mechanism is greater than the head diameter. In the elastically undeformed state (e.g., a restored state), the clip width is less than the head diameter. In this way the bracket connects at the neck of the fastener with the fastener head preventing the bracket from becoming detached and the fastener shoulder preventing contact between the bracket and the first component.

Figure 6:
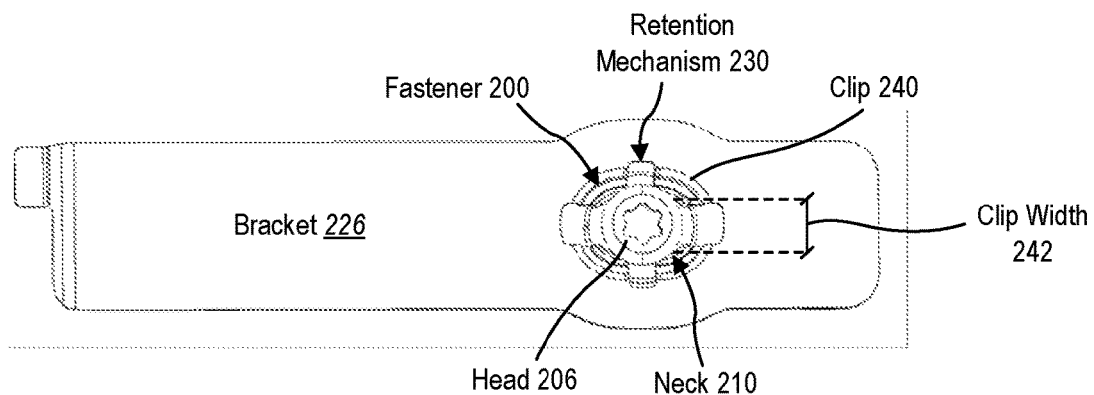
FIG. 6 is a top view of the fastener and bracket of FIG. 4, according to at least some embodiments of the present disclosure.

FIG. 6 is a top view of the embodiment of a fastener 200 and bracket 226 of FIG. 5 and FIG. 4. The retention mechanism 230 includes a plurality of clips 240 that elastically deform to an elastically deformed state around the head 206 of the fastener 200 to open up the retention mechanism 230 when the bracket 226 moves downward. The clips 240 elastically restore to the original clip width 242 to catch under the head 206 and inside the neck 210.

In some embodiments, the fastener connects a first electronic component of an electronic device to a board and/or housing of the electronic device, and the bracket is a second electronic component of the electronic device. In some embodiments, the fastener connects a first electronic component of an electronic device to a board and/or housing of the electronic device, and the bracket is an EMI shield for the first electronic component. In some embodiments, the fastener connects a first electronic component of an electronic device to a board and/or housing of the electronic device, and the bracket is applies a compressive force to a second electronic component of the electronic device to hold the second electronic component to the first electronic component, and optionally provide heat dissipation, electrically grounding, and/or EMI shielding for the second electronic component.

In some embodiments, a fastener and bracket of the present disclosure allow for simplified assembly of electronic devices as compared to conventional assembly methods. In some embodiments, a fastener and bracket of the present disclosure allow for simplified disassembly of electronic devices as compared to conventional disassembly methods (e.g., removal of the bracket and/or second component without removing the fastener and/or first component). In some embodiments, a fastener and bracket of the present disclosure allow for stronger assembly of electronic devices as compared to conventional assembly methods.

Figure 7:
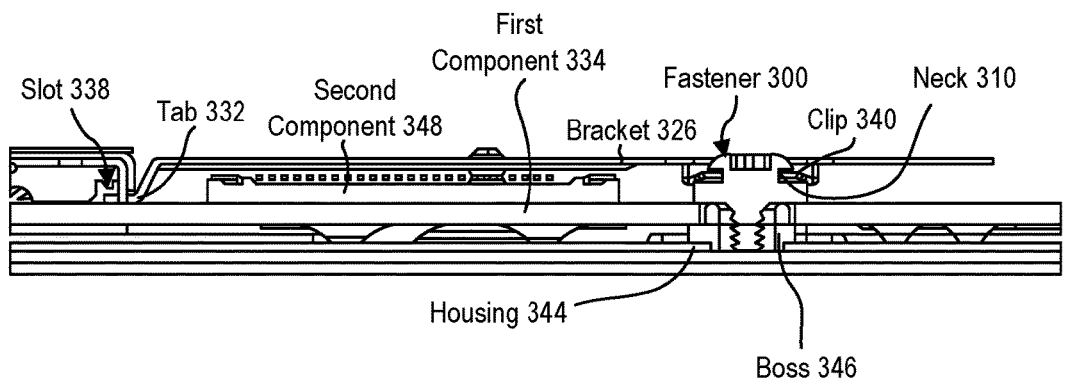
FIG. 7 is a side cross-sectional view of an electronic device including a fastener and bracket, according to at least some embodiments of the present disclosure.

FIG. 7 is a side cross-sectional view of an electronic device with a plurality of components retained by a fastener 300 and a bracket 326, according to the present disclosure. The fastener 300 applies a compressive force to affix a first component 334 to the housing 344 by threading into a boss 346 of the housing 346. After the fastener is threaded into the boss 346, a second component 348 is positioned on the first component 334. The bracket 326 is positioned on top of the second component 348 by engaging the tab 332 with a slot 338 of the housing 334 and forcing the bracket 326 downward onto the fastener 300. The clips 340 of the bracket 326 engage with the neck 310 to connect the bracket 326 to the fastener 300. The bracket 326 further retains the second component 348 in contact with the first component 334.

Figure 8:
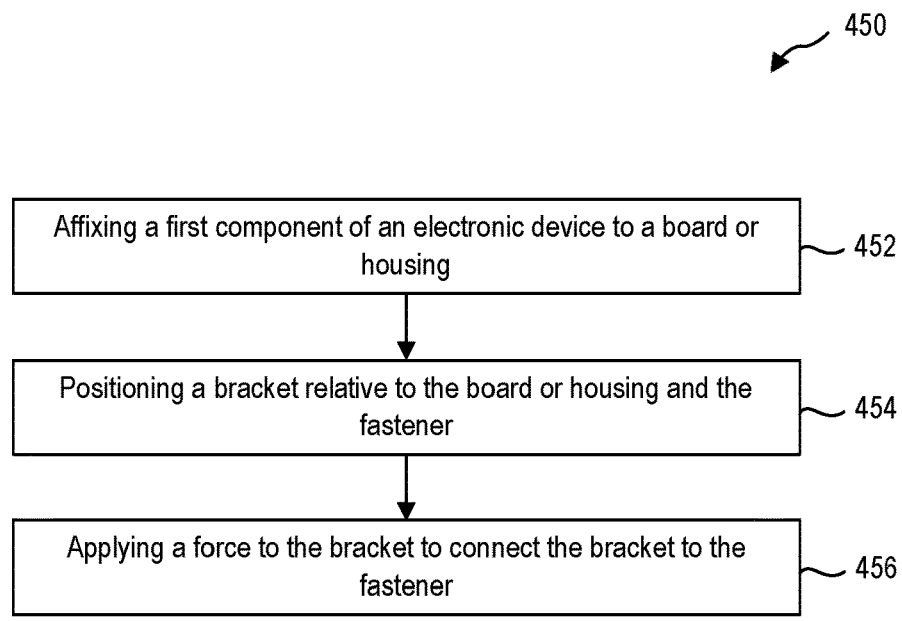
FIG. 8 is a flowchart illustrating a method of manufacturing an electronic device, according to at least some embodiments of the present disclosure.

FIG. 8 is a flowchart illustrating an embodiment of a method 450 of manufacturing an electronic device, according to some embodiments of the present disclosure. In some embodiments, a method 450 includes affixing (452) a first component of an electronic device to a board or housing of the electronic device with any embodiment of a fastener described herein. After affixing the first component, a bracket, which may be an electronic component of the electronic device, EM shielding for the electronic device, a thermal dissipation component, or a structural component of the electronic device, is then positioned (454) relative to the first component and the fastener. The method further includes applying (456) a force to the bracket to move the bracket relative to the fastener and connect the bracket to the fastener.

In some embodiments, the force is applied to the bracket and moves the bracket in a longitudinal direction (e.g., downward) of the fastener. In some embodiments, the force is applied to the bracket and moves the bracket in a lateral direction (e.g., sideways) of the fastener. In some embodiments, the force is applied to the bracket and moves the bracket in both a longitudinal and lateral direction of the fastener.

Figure 9:
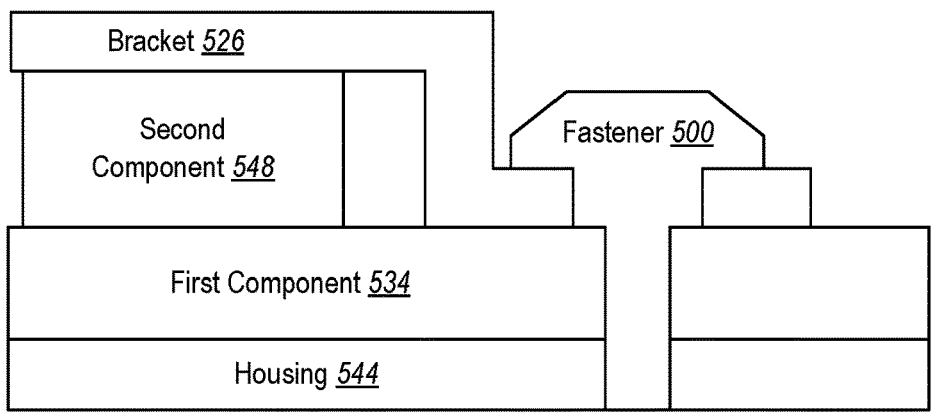
FIG. 9 is a side cross-sectional view of a system including a fastener and bracket, according to at least some embodiments of the present disclosure.

FIG. 9 is a system diagram of another embodiment of a system for retaining components in an electronic device. In some embodiments, the fastener 500 has a neck outer diameter that is equal to a shoulder outer diameter. The shoulder 508 contacts and applies a compressive force to the first component 534 against the housing 544. In some embodiments, the bracket 526 contacts and connects to the lateral surface of the neck 510 and/or shoulder 508 underneath a lower surface of the head 506 to retain the bracket 526 under the head 506 of the fastener 500 and apply a compressive force to the second component 548 to hold the second component 548 against the first component 534. In some embodiments, the bracket 526 is any embodiment of a bracket described herein.

INDUSTRIAL APPLICABILITY

The present disclosure relates generally to fasteners for coupling and retaining components. More particularly, the present disclosure relates to systems and methods for retaining components in an electronic device by affixing a fastener to a board, housing, or support, where the fastener connects at least two components to the board, housing, or support. In some embodiments, a fastener provides a compressive force to retain the first component while a second component connects or couples to a neck of the fastener. In some embodiments, the fastener is affixed to a board first and a second component is subsequently connected or coupled to the neck of the fastener.

In some embodiments, an electronic component includes a plurality of components that stacked in a vertical direction relative to a board or a housing. In conventional electronic devices, the first and second component are positioned on a board or housing and then both are retained by connecting a fastener through both components to the board or housing. This design requires both components to be positioned prior to connecting the fastener. Additionally, removal of the fastener will disconnect both of the components. However, a user may desire to affix only one of the components, such as to replace or repair the second component without removing the first component. Unnecessary movement of the components can risk damaging elements of the components, such as connection prongs, wires, transistors, capacitors, or other elements of the component circuitry.

In some embodiments of a connection system according to the present disclosure, a fastener provides both a compressive force to retain the first component on the board or housing and a connection point in or on which a second component is affixed. In a particular embodiment, the fastener is connected to a board through a hole in the first component, and a shoulder of the fastener contacts the first component to affix the first component to the board. In some embodiments, the fastener allows the second component to connect to the fastener longitudinally relative to the fastener body. In some embodiments, the fastener allows the second component to connect to the fastener laterally relative to the fastener body.

In some embodiments, the fastener includes a body with a longitudinal axis. The body has a first end and a second end positioned at opposite ends along the longitudinal axis. The first end of the body includes a mechanical interlocking feature (e.g., a threaded surface) that allows the fastener to connect to a board, housing, or other portion of an electronic device. The second end of the body includes a head. In some embodiments, the head is configured to receive torque to drive the fastener into the board, housing, or other portion of the electronic device.

The body is made of or includes, in some embodiments, a conductive material. In some embodiments, the conductive material is iron, aluminum, titanium, copper, magnesium, or alloys thereof, such as steel. In some embodiments, the conductive material is a polymer or other conductive material impregnated with conductive filaments or particles. In some embodiments, the body is made of or includes a nonconductive material. In some embodiments, the nonconductive is a polymer or composite. In embodiments in which the body is composed of conductive material, the system may be arranged so that the fastener provides a path to electrical ground for one or both of the first and second components while the first and second components are connected to the fastener. In embodiments in which the body is composed of conductive material, the system may be arranged so that the fastener is part of an arrangement that provides shielding to reduce electromagnetic interference (EMI) for components located within the shielding (e.g., the first and/or second components).

In some embodiments, the mechanical interlocking feature(s) of the fastener includes a threaded surface. In some embodiments, the mechanical interlocking feature(s) of the fastener includes a recess to engage with the board and/or housing. In some embodiments, the mechanical interlocking feature(s) of the fastener includes a protrusion to engage with the board and/or housing. In some embodiments, the mechanical interlocking feature(s) of the fastener include a convex surface adapted to interlock with a concave surface of the board or housing, or vice versa. In some embodiments, the mechanical interlocking feature(s) of the fastener includes a twist-lock feature, such as the lugs and grooves of a BNC connector, to engage with the board and/or housing. The mechanical interlocking feature(s) of the fastener may be any feature that allows the first end of the body to engage with the board and/or housing and apply a compressive force in the longitudinal direction.

The head of the fastener is integrally formed with the rest of the body. In some embodiments, the head of the fastener is configured to receive a torque from a driver or other tool to rotate the fastener. In some embodiments, the head includes a groove or recess to receive a flathead, Phillips, Torx Plus, Allen, or other format driver. In some embodiments, the head is configured to receive a longitudinal force. The longitudinal force may compress the fastener in the longitudinal direction and/or onto the board and/or housing.

A shoulder of the fastener may contact a first component and apply a force in the longitudinal direction to the first component. In some embodiments, the shoulder of the fastener contacts an electrical pad of the first component to provide an electrical pathway from the first component to the board and/or housing (e.g., a path to electrical ground). The shoulder projects laterally from the body perpendicularly from the longitudinal direction and is integrally formed with the body. In some embodiments, the shoulder has an upper surface and a lower surface that are substantially parallel to one another. In some embodiments, the shoulder has a lower surface that is perpendicular to the longitudinal direction and an upper surface that is curved or angled relative to the lower surface. In some embodiments, the shoulder has an upper surface that is perpendicular to the longitudinal direction and a lower surface that is curved or angled relative to the upper surface. In some embodiments, the shoulder has an upper surface that is curved or angled relative to a lateral direction and a lower surface that is curved or angled relative to the upper surface.

A fastener according to the present disclosure has a neck positioned longitudinally between the head and the shoulder. In some embodiments, the neck allows a second component to connect with and be retained by the fastener. The neck is a recess between the head and the shoulder into which a retention mechanism may engage to retain the second component.

The shoulder has a shoulder outer diameter that is greater than a head outer diameter. In some embodiments, the shoulder outer diameter and head outer diameter have a shoulder diameter ratio in a range having an upper value, a lower value, or upper and lower values including 1.1, 1.2, 1.3, 1.4, 1.5, 1.75, 2.0, 2.25, 2.5, 2.75, 3.0, or any values therebetween. In some embodiments, the shoulder diameter ratio is greater than 1.1. In some embodiments, the shoulder diameter ratio is less than 3.0. In some embodiments, the shoulder diameter ratio is between 1.1 and 3.0. In some embodiments, the shoulder diameter ratio is between 1.5 and 2.5. In some embodiments, it is critical the shoulder diameter ratio is greater than 1.5.

The neck has a neck outer diameter that is less than the head outer diameter. In some embodiments, the neck outer diameter and head outer diameter have a neck diameter ratio in a range having an upper value, a lower value, or upper and lower values including 0.3, 0.4, 0.5, 0.6, 0.7, 0.8, 0.9, 0.95, or any values therebetween. In some embodiments, the neck diameter ratio is greater than 0.3. In some embodiments, the neck diameter ratio is less than 0.95. In some embodiments, the neck diameter ratio is between 0.3 and 0.9. In some embodiments, the neck diameter ratio is between 0.5 and 0.75. In some embodiments, it is critical the neck diameter ratio is less than 0.8. In some embodiments, it is critical the neck diameter ratio is greater than a diameter of the bottom end and mechanical interlocking feature. In some embodiments, the neck and shoulder have the same outer diameter (e.g., the neck outer diameter and shoulder outer diameter are equal).

In some embodiments, the fastener has a total height from the first end to the second end in the longitudinal direction (e.g., from the mechanical interlocking feature to the head). The shoulder has a shoulder height. In some embodiments, the shoulder height and total height have a shoulder height ratio in a range having an upper value, a lower value, or upper and lower values including 0.05, 0.075. 0.10, 0.125, 0.15, 0.175, 0.20, 0.25, or any values therebetween. In some embodiments, the shoulder height ratio is greater than 0.05. In some embodiments, the shoulder height ratio is less than 0.25. In some embodiments, the shoulder height ratio is between 0.05 and 0.25. In some embodiments, the shoulder height ratio is between 0.10 and 0.20. In some embodiments, it is critical the shoulder height ratio is greater than 0.10.

In some embodiments, the shoulder height is in a range having an upper value, a lower value, or upper and lower values including any of 0.3 millimeters (mm), 0.4 mm, 0.5 mm, 0.6 mm, 0.7 mm, 0.8 mm, or any values therebetween. In some embodiments, a shoulder height is greater than 0.3 mm. In some embodiments, the shoulder height is less than 0.8 mm. In some embodiments, the shoulder height is between 0.3 mm and 0.8 mm. In some embodiments, the shoulder height is between 0.4 mm and 0.6 mm.

In some embodiments, the neck has a neck height. In some embodiments, the neck height and total height have a neck height ratio in a range having an upper value, a lower value, or upper and lower values including 0.025, 0.05, 0.075. 0.10, 0.125, 0.15, 0.175, 0.20, or any values therebetween. In some embodiments, the neck height ratio is greater than 0.025. In some embodiments, the neck height ratio is less than 0.20. In some embodiments, the neck height ratio is between 0.025 and 0.20. In some embodiments, the neck height ratio is between 0.05 and 0.10. In some embodiments, it is critical the neck height ratio is greater than 0.05.

In some embodiments, the neck height is in a range having an upper value, a lower value, or upper and lower values including any of 0.25 mm, 0.3 mm, 0.4 mm, 0.5 mm, 0.6 mm, or any values therebetween. In some embodiments, a neck height is greater than 0.25 mm. In some embodiments, the neck height is less than 0.6 mm. In some embodiments, the neck height is between 0.3 mm and 0.5 mm. In some embodiments, the neck height is between 0.3 mm and 0.4 mm.

In some embodiments, a distance in the longitudinal direction from a bottom surface of the shoulder to the top of the head (e.g., the shoulder, neck, and head) defines a connector height. In some embodiments, the connector height and total height have a connector height ratio in a range having an upper value, a lower value, or upper and lower values including 0.10, 0.15, 0.20, 0.30 0.40, 0.50, 0.60, 0.70, or any values therebetween. In some embodiments, the connector height ratio is greater than 0.10. In some embodiments, the connector height ratio is less than 0.70. In some embodiments, the connector height ratio is between 0.10 and 0.70. In some embodiments, the connector height ratio is between 0.25 and 0.6. In some embodiments, it is critical the connector height ratio is less than 0.50.

In some embodiments, the connector height is in a range having an upper value, a lower value, or upper and lower values including any of 0.3 mm, 0.4 mm, 0.5 mm, 0.6 mm, 0.7 mm, 0.8 mm, 0.9 mm, 1.0 mm, 1.1 mm, 1.2 mm, 1.3 mm, 1.4 mm, 1.5 mm, or any values therebetween. In some embodiments, a connector height is greater than 0.3 mm. In some embodiments, the connector height is less than 1.5 mm. In some embodiments, the connector height is between 0.3 mm and 1.5 mm. In some embodiments, the connector height is between 1.0 mm and 1.4 mm. In some embodiments, it is critical that the connector height is less than 1.3 mm so that the fastener does not require an increase to a dimension (z-height) of the device in which it is installed.

In some embodiments, the total height is in a range having an upper value, a lower value, or upper and lower values including any of 1.5 mm, 1.75 mm, 2.0 mm, 2.25 mm, 2.5 mm 2.75 mm, 3.0 mm, or any values therebetween. In some embodiments, a total height is greater than 1.5 mm. In some embodiments, the total height is less than 3.0 mm. In some embodiments, the total height is between 1.5 mm and 3.0 mm. In some embodiments, the total height is between 2.0 mm and 3.0 mm so that the fastener does not require an increase to a dimension (z-height) of the device in which it is installed.

A retention system according to the present disclosure may include a fastener according to any of the embodiments described herein and a bracket that connects to the second end of the fastener. In some embodiments, the bracket is rigid, semi-rigid, elastic, or combinations thereof. In some embodiments, the bracket applies a compressive force to an electronic component or other component of an electronic device to hold the component in place. In some embodiments, the bracket is an electronic component of the electronic device. For example, the bracket may be a printed circuit board or other electronic component. In some embodiments, the bracket connects to the fastener to facilitate a board-to-board B2B connection. In some embodiments, the bracket is radiopaque and provides electromagnetic interference (EMI) shielding to an electronic component covered by the bracket.

Embodiments of brackets according to the present disclosure include an aperture therein through which a portion of the fastener is positioned to connect the fastener and the bracket. In some embodiments, the aperture further includes a retention mechanism configured to engage with the fastener to connect the bracket to the fastener. The retention mechanism connects to the fastener above the shoulder. In some embodiments, the retention mechanism engages with the neck of the fastener and contacts a portion of the head adjacent the neck to limit and/or prevent movement of the bracket in the longitudinal direction of the fastener. In some embodiments, the retention mechanism is integrally formed with the bracket. In some embodiments, the retention mechanism is affixed to the bracket. In a particular embodiment, the retention mechanism is affixed in an aperture of a conventional electronic component to allow the conventional electronic component to be a bracket according to the present disclosure and connect to the fastener, as described herein.

In some embodiments, the aperture and retention mechanism allow the bracket to connect to the fastener after the fastener has been affixed to a board and/or housing. In some embodiments, the retention mechanism includes deformable clips, wings, tabs, clasps, etc. that allow the bracket to snap onto the head and engage with the neck of the fastener. In some embodiments, the aperture is tapered in a lateral direction relative to the longitudinal direction of the fastener. The aperture is tapered to allow a wide portion of the aperture with a larger clip width to pass over the head but not the shoulder. The taper then reduces the clip width toward a narrow portion with a second smaller clip width, which is smaller than the head outer diameter and engages with the neck to retain the bracket on the fastener.

In some embodiments, the bracket includes a tab at a second end opposite the aperture and retention mechanism. The tab may engage with a slot or clip on the board and/or housing to limit and/or prevent movement of the second end relative to the board and/or housing after the retention mechanism engages with the fastener. In some embodiments, the retention mechanism is located in a first half of the bracket opposite the second end with the tab. In some embodiments, the bracket has a plurality of retention mechanism configured to engage with a plurality of fasteners, according to the present disclosure.

In some embodiments, the retention mechanism has a clip width that is the shortest distance across the aperture. In some embodiments, the retention mechanism includes at least one elastically deformable clip that elastically deforms around the head of the fastener. In the elastically deformed state, the clip width of the retention mechanism is greater than the head diameter. In the elastically undeformed state (e.g., a restored state), the clip width is less than the head diameter.

In some embodiments, the fastener connects a first electronic component of an electronic device to a board and/or housing of the electronic device, and the bracket is a second electronic component of the electronic device. In some embodiments, the fastener connects a first electronic component of an electronic device to a board and/or housing of the electronic device, and the bracket is an EM shield for the first electronic component. In some embodiments, the fastener connects a first electronic component of an electronic device to a board and/or housing of the electronic device, and the bracket is applies a compressive force to a second electronic component of the electronic device to hold the second electronic component to the first electronic component.

In some embodiments, a fastener and bracket of the present disclosure allow for simplified assembly of electronic devices as compared to conventional assembly methods. In some embodiments, a fastener and bracket of the present disclosure allow for stronger assembly of electronic devices as compared to conventional assembly methods.

A method of manufacturing an electronic device, according to some embodiments of the present disclosure, includes affixing a first component of an electronic device to a board or housing of the electronic device with any embodiment of a fastener described herein. After affixing the first component, a bracket, which may be an electronic component of the electronic device, EMI shielding for the electronic device, or a structural component of the electronic device, is then positioned relative to the first component and the fastener. The method further includes applying a force to the bracket to move the bracket relative to the fastener and connect the bracket to the fastener.

In some embodiments, the force is applied to the bracket and moves the bracket in a longitudinal direction (e.g., downward) of the fastener. In some embodiments, the force is applied to the bracket and moves the bracket in a lateral direction (e.g., sideways) of the fastener. In some embodiments, the force is applied to the bracket and moves the bracket in both a longitudinal and lateral direction of the fastener.

The present disclosure relates to systems and methods for retaining components in an electronic device according to at least the examples provided in the sections below:

1. A fastener (e.g., fastener 100) for retaining a plurality of components within an electronic device, the fastener comprising:
    a body (e.g., body 102) having a bottom end and a top end, a longitudinal direction (e.g., longitudinal axis 109) extending between the bottom end and the top end;
    a mechanical interlocking feature (e.g., mechanical interlocking feature 104) integrally formed with the bottom end;
    a head (e.g., head 106) integrally formed with the top end;
    a shoulder (e.g., shoulder 108) integrally formed with the body and positioned between the mechanical interlocking feature and the head; and
    a neck (e.g., neck 110) positioned between the shoulder and the head, wherein a neck outer diameter is less than a head outer diameter and a shoulder outer diameter.
2. The fastener of section 1, wherein a distance in the longitudinal direction from a bottom surface of the shoulder to a top surface of the head is less than 1.3 millimeters.
3. The fastener of section 1 or 2, wherein a neck height is less than 0.25 millimeters.
4. The fastener of any preceding section, wherein the shoulder outer diameter is greater than the head outer diameter.
5. The fastener of any preceding section, wherein a total height of the body is less than 3 millimeters.
6. The fastener of section 5, wherein the shoulder outer diameter is greater than a total height of the body.
7. The fastener of any preceding section, wherein a shoulder height in the longitudinal direction is greater than a neck height.
8. The fastener of any preceding section, wherein the neck outer diameter is greater than a bottom end outer diameter.
9. A system for retaining a component in an electronic device, the system comprising:
    the fastener (e.g., fastener 100, 200, 300) of any preceding claim; and
    a bracket (e.g., bracket 226, 326) including:
        an aperture (e.g., aperture 228) therethrough, the aperture having a width greater than the head outer diameter of the fastener, and
        at least one retention mechanism (e.g., retention mechanism 230) in the aperture, the retention mechanism configured to engage with the neck of the fastener.
10. The system of section 9, the retention mechanism including an elastically deformable clip, wherein the clip defines a clip width (e.g., the distance between the arms of the clip) less than the head outer diameter.
11. The system of section 10, wherein the clip width is less than the neck outer diameter in an elastically undeformed state.
12. The system of any of sections 9-11, wherein the bracket is a board-to-board connector.
13. The system of any of sections 9-12, wherein the retention mechanism allows rotation of the fastener relative to the bracket.
14. The system of any of sections 9-13, wherein the retention mechanism is integrally formed with the bracket.
15. A method of manufacturing an electronic device, the method comprising:
    positioning a first component relative to a housing;
    affixing (452) the first component to the housing using the fastener of any of sections 1-8;
    positioning (454) a bracket relative to the first component and the fastener; and
    applying (456) a force to the bracket toward the fastener to affix the bracket to the fastener.

The articles "a," "an," and "the" are intended to mean that there are one or more of the elements in the preceding descriptions. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. For example, any element described in relation to an embodiment herein may be combinable with any element of any other embodiment described herein. Numbers, percentages, ratios, or other values stated herein are intended to include that value, and also other values that are "about" or "approximately" the stated value, as would be appreciated by one of ordinary skill in the art encompassed by embodiments of the present disclosure. A stated value should therefore be interpreted broadly enough to encompass values that are at least close enough to the stated value to perform a desired function or achieve a desired result. The stated values include at least the variation to be expected in a suitable manufacturing or production process, and may include values that are within 5%, within 1%, within 0.1%, or within 0.01% of a stated value.

A person having ordinary skill in the art should realize in view of the present disclosure that equivalent constructions do not depart from the spirit and scope of the present disclosure, and that various changes, substitutions, and alterations may be made to embodiments disclosed herein without departing from the spirit and scope of the present disclosure. Equivalent constructions, including functional "means-plus-function" clauses are intended to cover the structures described herein as performing the recited function, including both structural equivalents that operate in the same manner, and equivalent structures that provide the same function. It is the express intention of the applicant not to invoke means-plus-function or other functional claiming for any claim except for those in which the words 'means for' appear together with an associated function. Each addition, deletion, and modification to the embodiments that falls within the meaning and scope of the claims is to be embraced by the claims.

It should be understood that any directions or reference frames in the preceding description are merely relative directions or movements. For example, any references to "front" and "back" or "top" and "bottom" or "left" and "right" are merely descriptive of the relative position or movement of the related elements.

The present disclosure may be embodied in other specific forms without departing from its spirit or characteristics. The described embodiments are to be considered as illustrative and not restrictive. The scope of the disclosure is, therefore, indicated by the appended claims rather than by the foregoing description. Changes that come within the meaning and range of equivalency of the claims are to be embraced within their scope.

What is claimed is:

1. A fastener for retaining a plurality of components within an electronic device, the fastener comprising:
   a body having a bottom end and a top end, a longitudinal direction extending between the bottom end and the top end;
   a mechanical interlocking feature integrally formed with the bottom end;
   a head integrally formed with the top end, the head including a groove or recess being configured to receive a driver and being configured to receive torque from the driver to drive the fastener into a board, housing, or other portion of the electronic device;
   a shoulder integrally formed with the body and positioned between the mechanical interlocking feature and the head; and
   a neck positioned between the shoulder and the head, wherein a neck outer diameter is less than a head outer diameter and a shoulder outer diameter,
   wherein a total height of the body is less than 3 millimeters, and
   wherein the shoulder outer diameter is greater than the total height of the body.

2. The fastener of claim 1, wherein a distance in the longitudinal direction from a bottom surface of the shoulder to a top surface of the head is less than 1.3 millimeters.

3. The fastener of claim 1, wherein a neck height is less than 0.25 millimeters.

4. The fastener of claim 1, wherein the shoulder outer diameter is greater than the head outer diameter.

5. The fastener of claim 1, wherein a shoulder height in the longitudinal direction is greater than a neck height.

6. The fastener of claim 1, wherein the neck outer diameter is greater than a bottom end outer diameter.

7. A system for retaining a component in an electronic device, the system comprising:
   a fastener including:
      a body having a bottom end and a top end, a longitudinal direction extending between the bottom end and the top end,
      a mechanical interlocking feature integrally formed with the bottom end,
      a head integrally formed with the top end, the head including a groove or recess being configured to receive a driver and being configured to receive torque from the driver to drive the fastener into a board, housing, or other portion of the electronic device,
      a shoulder integrally formed with the body and positioned between the mechanical interlocking feature and the head, and
      a neck positioned between the shoulder and the head, wherein a neck outer diameter is less than a head outer diameter and a shoulder outer diameter,
      wherein a total height of the body is less than 3 millimeters, and
      wherein the shoulder outer diameter is greater than the total height of the body; and
   a bracket including:
      an aperture therethrough, the aperture having a width greater than the head outer diameter of the fastener, and
      at least one retention mechanism in the aperture, the retention mechanism configured to engage with the neck of the fastener.

8. The system of claim 7, the retention mechanism including an elastically deformable clip, wherein the clip defines a clip width less than the head outer diameter.

9. The system of claim 8, wherein the clip width is less than the neck outer diameter in an elastically undeformed state.

10. The system of claim 7, wherein the bracket is a board-to-board connector.

11. The system of claim 7, wherein the retention mechanism allows rotation of the fastener relative to the bracket.

12. The system of claim 7, wherein the retention mechanism is integrally formed with the bracket.

13. A method of manufacturing an electronic device, the method comprising:
   positioning a first component relative to a housing;
   affixing the first component to the housing using a fastener, the fastener including:
      a body having a bottom end and a top end, a longitudinal direction extending between the bottom end and the top end,
      a mechanical interlocking feature integrally formed with the bottom end,
      a head integrally formed with the top end, the head including a groove or recess being configured to receive a driver and being configured to receive torque from the driver to drive the fastener into a board, housing, or other portion of the electronic device,
      a shoulder integrally formed with the body and positioned between the mechanical interlocking feature and the head, and
      a neck positioned between the shoulder and the head, wherein a neck outer diameter is less than a head outer diameter and a shoulder outer diameter,
      wherein a total height of the body is less than 3 millimeters, and
      wherein the shoulder outer diameter is greater than the total height of the body;
   positioning a bracket relative to the first component and the fastener; and
   applying a force to the bracket toward the fastener to affix the bracket to the fastener.

14. The fastener of claim 1, wherein the mechanical interlocking feature includes a threaded surface.

15. The fastener of claim 1, wherein the body is an electrically conductive material.

16. The fastener of claim 1, wherein the body includes electrically conductive particles.

17. The fastener of claim 1, wherein the body and head provide a conductive path therethrough.

18. The system of claim 7, wherein the fastener and the bracket provide a conductive path therebetween.

19. The system of claim 7, wherein the mechanical interlocking feature includes a first surface configured to engage with a second surface of the bracket.

20. The fastener of claim 19, wherein first surface is concave, and the second surface is convex.

* * * * *